(12) United States Patent
Anderson et al.

(10) Patent No.: US 7,800,223 B2
(45) Date of Patent: Sep. 21, 2010

(54) CHIP-SCALE MONOLITHIC LOAD SWITCH FOR PORTABLE APPLICATIONS

(75) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 836 days.

(21) Appl. No.: 11/336,306

(22) Filed: Jan. 18, 2006

(65) Prior Publication Data

US 2006/0163709 A1    Jul. 27, 2006

Related U.S. Application Data

(60) Provisional application No. 60/647,536, filed on Jan. 26, 2005.

(51) Int. Cl.
*H01L 23/34* (2006.01)
*H01L 27/10* (2006.01)

(52) U.S. Cl. .................. 257/724; 257/204; 257/723

(58) Field of Classification Search .............. 257/7, 257/8, 723, 724, E23.077, E23.079, 203, 257/204, 206
See application file for complete search history.

(56) References Cited

U.S. PATENT DOCUMENTS 6,958,515 B2 * 10/2005 Hower et al. ................. 257/341
7,187,069 B2 *  3/2007 Uematsu et al. ............. 257/685

* cited by examiner

*Primary Examiner*—Hung Vu
(74) *Attorney, Agent, or Firm*—Robert D. Atkins

(57) ABSTRACT

A chip-scale package houses a monolithic semiconductor die containing first and second lateral metal oxide semiconductor field effect transistors (MOSFETs) formed on a surface of the semiconductor die. The MOSFETs are formed using a lateral double diffused metal oxide semiconductor structure. The first MOSFET has a first conduction terminal coupled to a first package terminal and a second conduction terminal coupled to a second package terminal. The second MOSFET has a first conduction terminal coupled to a control terminal of the first MOSFET, a second conduction terminal coupled to a third package terminal, and a control terminal coupled to a fourth package terminal. A resistor is coupled between the first package terminal and the control terminal of the first MOSFET. A logic level enable signal controls the first MOSFET to enable the second MOSFET to connect a DC voltage from the first package terminal to the second package terminal.

21 Claims, 2 Drawing Sheets

CHIP-SCALE MONOLITHIC LOAD SWITCH FOR PORTABLE APPLICATIONS

CLAIM TO DOMESTIC PRIORITY

The present non-provisional patent application claims priority to provisional application Ser. No. 60/647,536, entitled "Chip-scale Monolithic Load Switch for Portable Applications", and filed on Jan. 26, 2005, by Anderson et al.

FIELD OF THE INVENTION

The present invention relates in general to electronic circuits and semiconductor devices and, more particularly, to an integrated or monolithic load switching circuit for portable applications.

BACKGROUND OF THE INVENTION

Portable electronic devices, such as cellular phones, two-way pagers, laptop computers, personal digital assistants (PDAs), and music players, are popular and have many uses with consumers and businesses alike. Most portable electronic devices are designed to be small, compact, battery powered, and yet still provide a host of features and conveniences. The typical portable electronic device contains components, such as integrated circuits, discrete semiconductor devices, passive devices, piezoelectric devices, liquid crystal display (LCD), and mechanical devices, encased within a plastic or metal housing.

Many of the components in the portable electronic device require a direct current (DC) operating potential to function. Some components are continuously connected to the DC power supply voltage. Other components, such as the LCD and piezoelectric devices, receive the DC power supply voltage only when activated. For such components, a load switching circuit is used to connect the DC power supply to the load component to activate the device. The load switching circuit receives an enable signal which couples the DC operating potential through the load switch to the load component to allow it to function.

The load switching circuit is typically implemented with discrete transistors and discrete passive devices. The default state of the load switching circuit is to disconnect the DC power supply from the load component. A discrete pass transistor is rendered conductive in response to the enable signal to couple the DC operating potential to the load component.

Component size and level of integration are important factors in the design of the portable electronic devices. The space available on the printed circuit boards of portable electronic devices is usually a premium design consideration. The designers and manufacturers of portable electronic devices continuously demand faster speed, more functionality, less power consumption, smaller size, and higher integration when selecting electronic component parts for their systems. The discrete components used to implement the load switching circuit consumes more area of the printed circuit board than many portable electronic device manufacturers may prefer.

A need exists for semiconductor devices and packages which consume less area in portable electronic devices having limited board space.

SUMMARY OF THE INVENTION

In one embodiment, the present invention is a chip-scale package housing a monolithic semiconductor die and having first, second, third, and fourth package terminals. The monolithic semiconductor die consists essentially of a first lateral metal oxide semiconductor field effect transistor (MOSFET) formed on a surface of the semiconductor die. The first lateral MOSFET has a first conduction terminal coupled to the first package terminal and a second conduction terminal coupled to the second package terminal. A second lateral MOSFET is formed on the surface of the semiconductor die. The second lateral MOSFET has a first conduction terminal coupled to a control terminal of the first lateral MOSFET, a second conduction terminal coupled to the third package terminal, and a control terminal coupled to the fourth package terminal. A resistor is coupled between the first package terminal and the control terminal of the first lateral MOSFET.

In another embodiment, the present invention is a monolithic semiconductor die housed within semiconductor package, comprising a first lateral metal oxide semiconductor field effect transistor (MOSFET) formed on a surface of the semiconductor die. The first lateral MOSFET has a first conduction terminal coupled to a first package terminal and a second conduction terminal coupled to a second package terminal. A second lateral MOSFET is formed on the surface of the semiconductor die. The second lateral MOSFET has a first conduction terminal coupled to a control terminal of the first lateral MOSFET, a second conduction terminal coupled to a third package terminal, and a control terminal coupled to a fourth package terminal.

In another embodiment, the present invention is a cellular telephone, comprising a first semiconductor die for providing communication signal processing and a second semiconductor die for performing load switching to the first semiconductor die. The second semiconductor die is housed in a chip-scale package and includes a first lateral metal oxide semiconductor field effect transistor (MOSFET) formed on a surface of the semiconductor die. The first lateral MOSFET has a first conduction terminal coupled to a first package terminal and a second conduction terminal coupled to a second package terminal. A second lateral MOSFET is formed on the surface of the semiconductor die. The second lateral MOSFET has a first conduction terminal coupled to a control terminal of the first lateral MOSFET, a second conduction terminal coupled to a third package terminal, and a control terminal coupled to a fourth package terminal.

In another embodiment, the present invention is a method of making a monolithic semiconductor die housed within a semiconductor package, comprising the steps of forming a first lateral metal oxide semiconductor field effect transistor (MOSFET) on a surface of the semiconductor die, the first lateral MOSFET having a first conduction terminal coupled to a first package terminal and a second conduction terminal coupled to a second package terminal, and forming a second lateral MOSFET on the surface of the semiconductor die, the second lateral MOSFET having a first conduction terminal coupled to a control terminal of the first lateral MOSFET, a second conduction terminal coupled to a third package terminal, and a control terminal coupled to a fourth package terminal.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
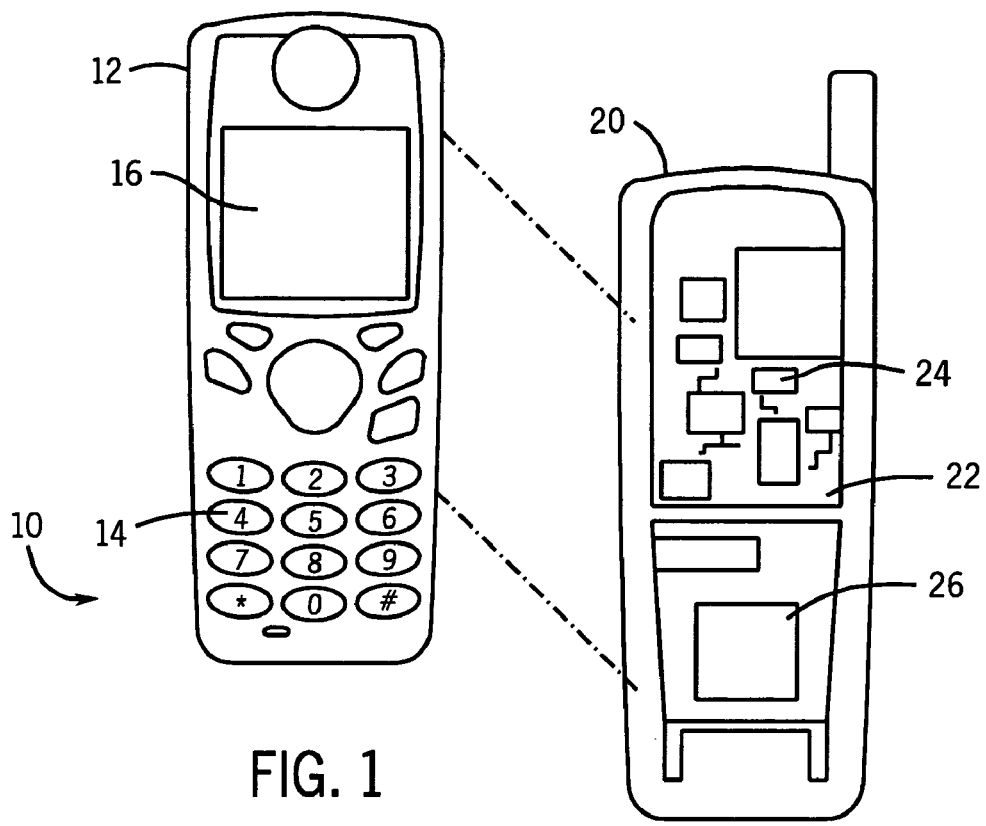
FIG. 1 illustrates a cellular telephone with a printed circuit board containing integrated circuits and semiconductor devices.

Referring to FIG. 1, a cellular phone 10 is shown having a front body 12 housing keyboard 14 and liquid crystal display (LCD) 16. Cell phone 10 further includes a rear body 20 housing PCB 22. PCB 22 is separated into radio frequency (RF) signal processing section 24 and baseband signal processing section 26, separated by shielding. The RF signal processing section 24 includes electronic components such as RF amplifier stage, modulator, demodulator, oscillator, and power management. The RF signal processing section receives RF signals, downconverts, and demodulates the signals to baseband signals. The baseband signal processing section 24 includes electronic components and devices such as microprocessor, analog to digital converter, digital to analog converter, memory, control logic, and analog amplifier. The baseband signal processing section 24 further includes electro-mechanical devices such as LCD, piezoelectric vibrator, microphone, and speaker. The baseband signal processing section 26 processes the baseband information so the user can speak and hear over the cell phone.

Most if not all of the electrical components and devices on PCB 22 require a direct current (DC) operating potential to function. Cell phone 10 has one lithium-ion battery source, e.g. 3.6 volts DC, attached to rear body 20. Many of the electronic devices are hard-wired or continuously connected to the requisite DC operating voltage. Other electrical components, such as LCD backlight, piezoelectric vibrator, microphone, speaker, and certain amplifier stages, are connected to the DC power supply only when activated. In such cases, a load switching circuit is used to activate the electrical components or devices which are needed at the time by connecting each to the DC power supply. By the same token, the load switching circuit is used to de-activate the electrical components or devices which are not being used by disconnecting each from the requisite DC power supply.

For example, the piezoelectric vibrator may be activated by a load switching circuit connecting the DC power supply to the vibrator. The piezoelectric vibrator is deactivated by the load switching circuit blocking the DC power supply to the vibrator. Likewise, the microphone and speaker may be enabled for operation by a load switching circuit. The load switching circuit routes the DC operating voltage to the component and enables its electrical/mechanical operation, or blocks the DC operating voltage from reaching the component to disable its operation. The backlight of LCD 16 is illuminated by connecting it to the DC power supply through a load switching circuit, and turned off by causing the load switching circuit to electrically disconnect the DC power supply. When using a multi-band cell phone, the amplifier stages in the selected band are enabled by a load switching circuit connecting the selected amplifier stages to the DC power supply, while other amplifier stages supporting the non-selected bands are not needed and are disconnected from the DC power supply by load switching circuits. In battery driven applications, the load switching circuit conserves power by supplying the DC operating voltage to the electronic device only when needed and isolates the electronic device from its operating voltage when not in use.

Figure 2:
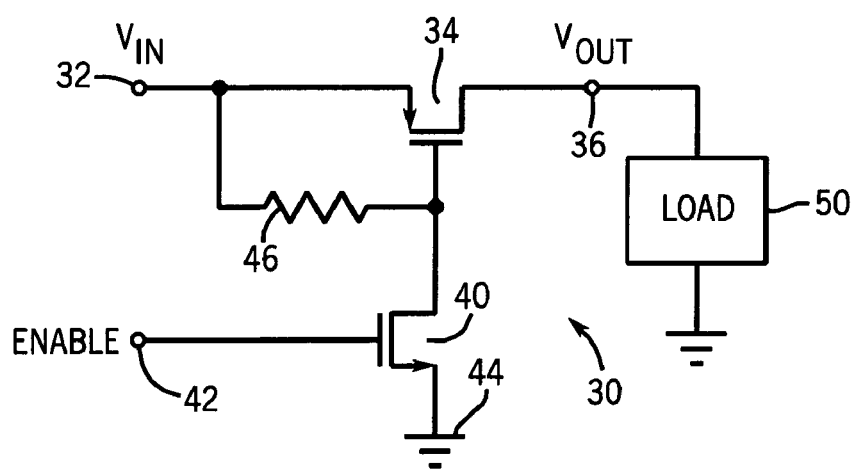
FIG. 2 is a schematic diagram of a load switching circuit.

One embodiment of the load switching circuit is shown in FIG. 2. Load switching circuit 30 receives DC voltage $V_{IN}$ on terminal 32. A p-channel transistor 34 has a source coupled to terminal 32 and a drain coupled to terminal 36. P-channel transistor 34 is a 12-20 volt lateral metal oxide semiconductor field effect transistor (MOSFET) having a drain-source on resistance $R_{DSon}$ of 0.1 ohms with gate voltage of 2.5 volts. The gate of transistor 34 is coupled to the drain of n-channel transistor 40. N-channel transistor 40 is a 12-20 volt MOSFET having a much higher $R_{DSon}$ than transistor 34. The gate of transistor 40 receives an enable control signal on terminal 42. The enable signal is a logic level control signal. The source of transistor 40 is coupled to terminal 44, which is a ground terminal. Resistor 46 is coupled between terminal 32 and the gate of transistor 34. Resistor 46 is selected to have a typical value of several to several hundreds Kohms.

Assume a DC operating voltage $V_{IN}$, say 3.6 VDC, is applied to terminal 32. When the enable signal is a high voltage or logic one, transistor 40 is operating in a conductive state. Transistor 40 conducts current through resistor 46 and pulls the gate voltage of transistor 34 to a low value. The conduction path through transistor 34 is enabled to pass the operating voltage $V_{IN}$, less the drain-source voltage drop across transistor 34, to terminal 36 as output voltage $V_{OUT}$. Load 50 is connected to terminal 36 and activates upon receiving the output voltage $V_{OUT}$. Load 50 represents electrical components and devices on PCB 22 which are activated by load switching circuit 30. For example, load 50 may be the piezoelectric vibrator which buzzes to notify the user of an incoming call or message or to signal an alarm. Load 50 may also be a speaker, microphone, LCD backlight, amplifier, or other active semiconductor device in cell phone 10. The high voltage level of $V_{OUT}$ enables the operation of load 50. Transistor 34 is a power MOSFET having sufficient current carrying capacity to supply the power requirements of load 50.

When the enable signal is a low voltage or logic zero, transistor 40 rendered non-conductive. Resistor 46 operates as a pull-up resistor to apply the high DC voltage from terminal 32 to the gate of p-channel transistor 34. Transistor 34 turns off and blocks the operating voltage $V_{IN}$ from terminal 36. The low voltage level of $V_{OUT}$ disables the operation of load 50. Accordingly, load switching circuit 30 enables or disables the operation of load 50 based on the logic level of the enable signal. Transistor 40 operating in response to the logic state of the enable signal represents a logic level control circuit to the power transistor 34. By disconnecting load 50 from its DC power supply, the system consumes less power which is desirable in battery driven applications.

The space limitations of PCB 22 in cell phone 10 dictate that the use of discrete components should be minimized and eliminated where possible. The semiconductor die or device within each discrete component is small compared to its overall package size. The same issue exists with other portable electronic systems having space limitations, such as radios, two-way pagers, digital recorders, laptop computers, personal digital assistants (PDAs), compact disk players, compact video players, and the like. To support this design preference, in the following description, load switching circuit 30 is integrated into a single monolithic chip-scale package. The advantage of integrating the load switching circuit 30 is magnified by the multiple instances of the load switch typically found on PCB 22. Load switching circuits like 30 may be used in several places on PCB 22, e.g., to switch on and off each of the LCD backlight, piezoelectric vibrator, speakers, microphone, power amplifier stages, etc.

In addition, other electronic systems that do not necessarily have space limitations or portable applications, e.g. personal computers, energy systems, telecommunication systems, audio-video equipment, consumer electronics, and automotive components, can benefit from the cost savings and design efficiencies associated with the integration of discrete components.

In the present embodiment, the electrical components of load switching circuit 30 are integrated into a single monolithic package 60 having a 1.15×1.15 square millimeter (mm$^2$) footprint. The height of package 60 is 0.8 mm to accommodate the low profile requirement. The power P-MOS transistor 34 occupies about 99% of the die area (1.3 mm$^2$), while the N-MOS transistor 40 occupies about 1% of the die area (0.13 mm$^2$).

Figure 3:
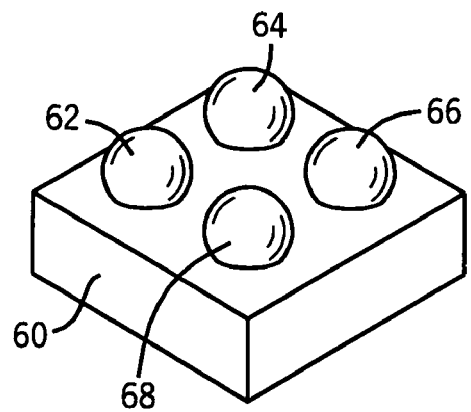
FIG. 3 is a monolithic chip-scale package containing the load switching circuit of FIG. 2.

As shown in FIG. 3, semiconductor package 60 is a four-terminal chip-scale or ball grid array package housing a monolithic semiconductor die which contains load switching circuit 30. Bumps 62-68 are formed on the chip-scale package. Bump 62 is electrically coupled to the source of transistor 34; bump 64 is electrically coupled to drain of transistor 34; bump 66 is electrically coupled to the source of transistor 40; bump 68 is electrically coupled to the gate of transistor 40. Alternatively, in an IC package with external pins, e.g., SOP or DIP, the external connections from the semiconductor die to the package terminals can be made by wire bonds.

Semiconductor package 60 occupies significantly less space than conventional discrete components providing the same function. In fact, semiconductor package 60 uses 68% less space on PCB 22 as compared to a conventional discrete power p-channel MOSFET alone. The difference is more pronounced when taking into account a discrete n-channel transistor and pull-up resistor and interconnecting PCB tracks. The small footprint and low profile of semiconductor package 60 is applicable to portable electronic devices requiring efficient and compact components, such as load switching circuits used in cellular phones. The load switching circuit 30 contained within semiconductor package 60 provides a convenient and space efficient level shifting control function in response to a logic level control signal, as an integrated chip-scale solution, for connecting and disconnecting the DC power supply to electrical and electro-mechanical devices in portable electronic applications.

Figure 4:
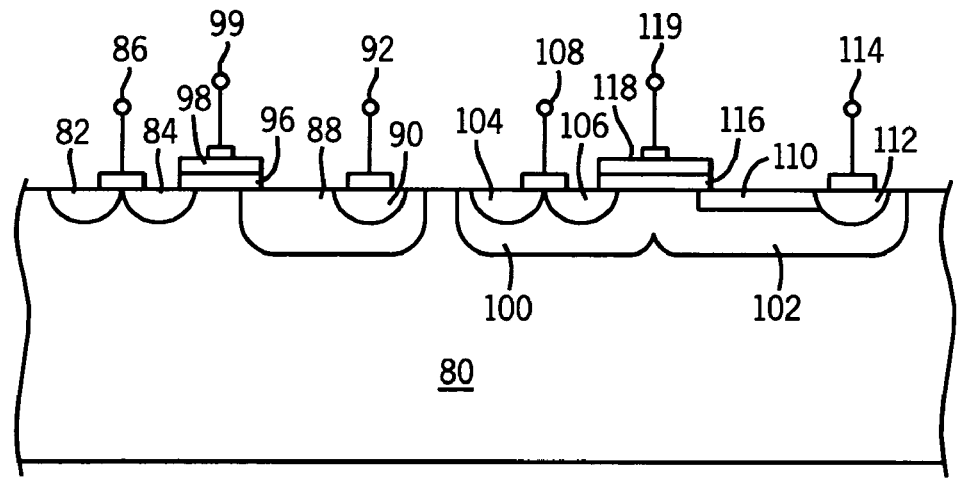
FIG. 4 is a cross-sectional view of one monolithic embodiment of the load switching circuit.

Further detail of the monolithic semiconductor device 78 is shown in FIG. 4 including the transistors 34 and 40 portion of load switching circuit 30. The device components are not necessarily drawn to scale. The semiconductor device uses lateral MOSFET structures for the P-MOS power device and N-MOS transistor. The lateral transistors are formed on the surface of semiconductor device 78. Alternately transistor 34 and/or 40 can use a lateral double diffused MOS structure.

In the cross-sectional view, substrate 80 is made of N-type semiconductor material and provides structural support. The following regions and layers are formed on substrate 80 using semiconductor manufacturing processes understood by those skilled in the art. The manufacturing process includes layering, patterning, doping, and heat treatment. In the layering process, materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation.

Using the above semiconductor manufacturing processes, N+ body region 82 and P+ source region 84 are formed along the surface of substrate 80. Metal layer 86 is formed over P+ source region 84 to provide the source terminal of P-MOS transistor 34. Metal layer 86 electrically connects to bump 62. P– well region 88 is formed along the surface of substrate 80. P+ drain region 90 is formed along the surface of P– well region 88. Metal layer 92 is formed over P+ drain region 90 to provide the drain terminal of P– MOS transistor 34. Metal layer 92 electrically connects to bump 64. Oxide layer 96 is formed over P+ source region 84, N-substrate 80, and P– well region 88. Gate region 98 is formed over oxide layer 96. Metal layer 99 is formed over gate region 98 to provide the gate terminal of P-MOS transistor 34. P-MOS transistor 34 is the power device used to source operating current to load 50 and is given a larger proportion of the die area of semiconductor device 78 as compared to N-MOS transistor 40.

Using the above semiconductor manufacturing processes, P– well region 100 and P– well region 102 are formed along the surface of substrate 80. P+ body region 104 and N+ source region 106 are formed along the surface of P– well region 100. Metal layer 108 is formed over N+ source region 106 to provide the source terminal of N-MOS transistor 40. Metal layer 108 electrically connects to bump 66. N– drift region 110 and N+ drain region 112 are formed along the surface of P– well region 102. Metal layer 114 is formed over N+ drain region 112 to provide the drain terminal of N– MOS transistor 40. Oxide layer 116 is formed over N+ source region 106, P– wells 100-102, and N– drift region 110. Gate region 118 is formed over oxide layer 116. Metal layer 119 is formed over gate region 118 to provide the gate terminal of N-MOS transistor 40. Metal layer 119 electrically connects to bump 68. Metal layer 114 electrically connects to metal layer 99. P– well region 100 and P– well region 102 merge together under oxide layer 116 and gate region 118. For other connections not shown, terminal 92 would be connected to terminal 119 and resistor 46 would be coupled between terminal 92 and terminal 108.

Figure 5:
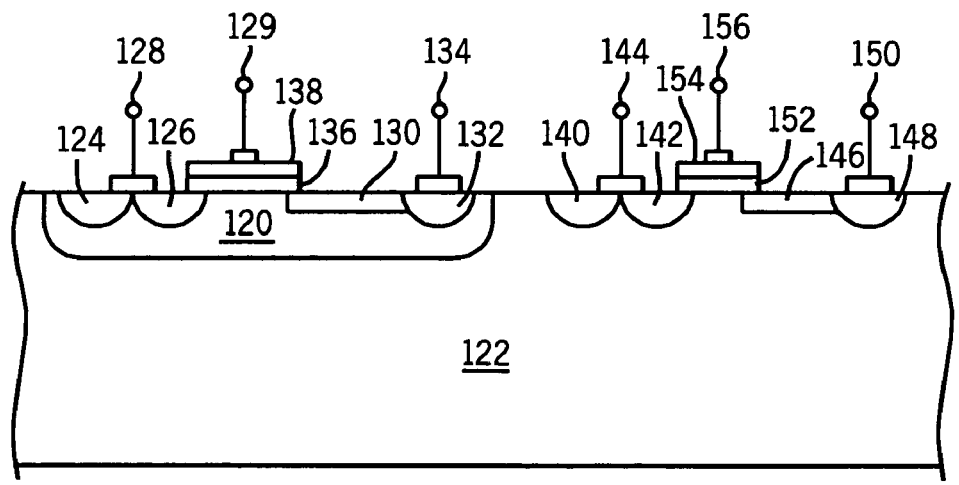
FIG. 5 is a cross-sectional view of an alternate embodiment of the monolithic load switching circuit.

Another embodiment of the transistors 34 and 40 portion of load switching circuit 30 is shown in the cross-sectional view of FIG. 5. The device components are not necessarily drawn to scale. Using the above semiconductor manufacturing processes, N– well region 120 is formed along the surface of P– substrate 122. N+ body region 124 and P+ source region 126 are formed along the surface of N– well region 120. Metal layer 128 is formed over P+ source region 126 to provide the source terminal of P-MOS transistor 34. Metal layer 128 electrically connects to bump 62. P– drift region 130 and P+ drain region 132 are formed along the surface of N– well region 120. Metal layer 134 is connected to P+ drain region 132 to provide the drain terminal of P-MOS transistor 34. Metal layer 134 electrically connects to bump 64. Oxide layer 136 is formed over P+ source region 126, N– well region 120, and P– drift region 130. Gate region 138 is formed over oxide layer 136. Metal layer 129 is formed over gate region 128 to provide the gate terminal of P-MOS transistor 34. Again, P-MOS transistor 34 is the power device used to source operating current to load 50 and is given a larger portion of the die area as compared to N-MOS transistor 40.

Using the above semiconductor manufacturing processes, P+ body region 140 and N+ source region 142 are formed along the surface of P– substrate 122. Metal layer 144 is formed over N+ source region 142 to provide the source terminal of N-MOS transistor 40. Metal layer 144 electrically connects to bump 66. N– drift region 146 and N+ drain region 148 are formed along the surface of P– substrate 122. Metal layer 150 is formed over N+ drain region 148 to provide the drain terminal of N-MOS transistor 40. Oxide layer 152 is formed over N+ source region 142, P– substrate 122, and N– drift region 146. Gate region 154 is formed over oxide layer 152. Metal layer 156 is formed over gate region 154 to provide the gate terminal of N-MOS transistor 40. Metal layer 156 electrically connects to bump 68. Metal layer 150 electrically connects to metal layer 129. For other connections not shown, terminal 134 would be connected to terminal 156 and resistor 46 would be coupled between terminal 134 and terminal 144.

One advantage of integrating load switching circuit in the chip-scale package is that the monolithic device occupies significantly less space than conventional discrete components providing the same function. The lateral device layout keeps the construction of the semiconductor die relatively thin, using a small number of mask layers, and permits ready connection from the key circuit nodes to the ball grid array bumps. The small footprint and low profile of the semiconductor package is particularly applicable to portable electric devices requiring efficient and compact components. The load switching circuit contained within the semiconductor package provides a convenient and space efficient level shifting control function in response to a logic level control signal for connecting and disconnecting the DC power supply to electrical and electro-mechanical devices in portable electronic applications.

While one or more embodiments of the present invention have been illustrated in detail, the skilled artisan will appreciate that modifications and adaptations to those embodiments may be made without departing from the scope of the present invention as set forth in the following claims.

What is claimed is:

1. A chip-scale package housing a monolithic semiconductor die and having first, second, third, and fourth package terminals, consisting essentially of:
    a first lateral metal oxide semiconductor field effect transistor (MOSFET) formed on a surface of the semiconductor die, the first lateral MOSFET having a first conduction terminal coupled to the first package terminal and a second conduction terminal coupled to the second package terminal;
    a second lateral MOSFET formed on the surface of the semiconductor die, the second lateral MOSFET having a first conduction terminal coupled to a control terminal of the first lateral MOSFET, a second conduction terminal coupled to the third package terminal, and a control terminal coupled to the fourth package terminal; and
    a resistor coupled between the first package terminal and the control terminal of the first lateral MOSFET.

2. The chip-scale package of claim 1, wherein the first and second lateral MOSFETs are formed using a lateral double diffused metal oxide semiconductor structure.

3. The chip-scale package of claim 1, wherein the first and second lateral MOSFETs are formed on a substrate having a first conductivity type.

4. The chip-scale package of claim 3, wherein the first lateral MOSFET includes:
    a source region of a second conductivity type formed on the surface of the semiconductor die;
    a first well region of the second conductivity type formed on the surface of the semiconductor die;
    a drain region of the second conductivity type formed on the surface of the semiconductor die within the first well region;
    an oxide layer formed over a channel region between the source region and the first well region; and
    a gate region formed over the oxide layer.

5. The chip-scale package of claim 3, wherein the second lateral MOSFET includes:
    a second well region of the second conductivity type formed on the surface of the semiconductor die;
    a source region of the first conductivity type formed on the surface of the semiconductor die within the second well region;
    a third well region of the second conductivity type formed on the surface of the semiconductor die;
    a drain region of the first conductivity type formed on the surface of the semiconductor die within the third well region;
    a drift region of the first conductivity type formed on the surface of the semiconductor die in contact with the drain region;
    an oxide layer formed over a channel region between the source region and the drift region; and
    a gate region formed over the oxide layer.

6. The chip-scale package of claim 5, wherein the second and third well regions merge under the gate region.

7. A monolithic semiconductor die housed within a semiconductor package, comprising:
    a first lateral metal oxide semiconductor field effect transistor (MOSFET) formed on a surface of the semiconductor die, the first lateral MOSFET having a first conduction terminal coupled to a first package terminal and a second conduction terminal coupled to a second package terminal; and
    a second lateral MOSFET formed on the surface of the semiconductor die, the second lateral MOSFET having a first conduction terminal coupled to a control terminal of the first lateral MOSFET, a second conduction terminal coupled to a third package terminal, and a control terminal coupled to a fourth package terminal, the second lateral MOSFET including,
        (a) a first well region of a first conductivity type formed on the surface of the semiconductor die,
        (b) a source region of a second conductivity type formed on the surface of the semiconductor die within the first well region,
        (c) a second well region of the first conductivity type formed on the surface of the semiconductor die,
        (d) a drain region of the second conductivity type formed on the surface of the semiconductor die within the second well region,
        (e) a drift region of the second conductivity type formed on the surface of the semiconductor die in contact with the drain region,
        (f) an oxide layer formed over a channel region between the source region and the drift region, and
        (g) a gate region formed over the oxide layer;
    wherein the first and second well regions merge under the gate region.

8. The monolithic semiconductor die of claim 7, further including a resistor coupled between the first package terminal and the control terminal of the first lateral MOSFET.

9. The monolithic semiconductor die of claim 7, wherein the first and second lateral MOSFETs are formed using a lateral double diffused metal oxide semiconductor structure.

10. The monolithic semiconductor die of claim 7, wherein the first and second lateral MOSFETs are formed on a substrate having the second conductivity type.

11. The monolithic semiconductor die of claim 10, wherein the first lateral MOSFET includes:

a source region of the first conductivity type formed on the surface of the semiconductor die;
a third well region of the first conductivity type formed on the surface of the semiconductor die;
a drain region of the first conductivity type formed on the surface of the semiconductor die within the third well region;
an oxide layer formed over a channel region between the source region and the third well region; and
a gate region formed over the oxide layer.

12. A monolithic semiconductor die housed within a semiconductor package, comprising:
a first lateral metal oxide semiconductor field effect transistor (MOSFET) formed on a surface of the semiconductor die, the first lateral MOSFET having a first conduction terminal coupled to a first package terminal and a second conduction terminal coupled to a second package terminal, the first lateral MOSFET including,
   (a) a source region of a second conductivity type formed on the surface of the semiconductor die,
   (b) a first well region of the second conductivity type formed on the surface of the semiconductor die,
   (c) a drain region of the second conductivity type formed on the surface of the semiconductor die within the first well region,
   (d) an oxide layer formed over a channel region between the source region and the first well region, and
   (e) a gate region formed over the oxide layer; and
a second lateral MOSFET formed on the surface of the semiconductor die, the second lateral MOSFET having a first conduction terminal coupled to a control terminal of the first lateral MOSFET, a second conduction terminal coupled to a third package terminal, and a control terminal coupled to a fourth package terminal, the second MOSFET including,
   (f) a second well region of the second conductivity type formed on the surface of the semiconductor die,
   (g) a source region of the first conductivity type formed on the surface of the semiconductor die within the second well region,
   (h) a third well region of the second conductivity type formed on the surface of the semiconductor die,
   (i) a drain region of the first conductivity type formed on the surface of the semiconductor die within the third well region,
   (j) a drift region of the first conductivity type formed on the surface of the semiconductor die in contact with the drain region,
   (k) an oxide layer formed over a channel region between the source region and the drift region, and
   (l) a gate region formed over the oxide layer;
wherein the first and second lateral MOSFETs are formed on a substrate having a first conductivity type.

13. The monolithic semiconductor die of claim 12, wherein the second and third well regions merge under the gate region.

14. A semiconductor device, comprising:
a semiconductor package having no more than four external package terminals; and
a monolithic semiconductor die housed within the semiconductor package, the monolithic semiconductor die including,
   (a) a first lateral metal oxide semiconductor field effect transistor (MOSFET) formed on a surface of the semiconductor die, the first lateral MOSFET having a first conduction terminal coupled to a first package terminal and a second conduction terminal coupled to a second package terminal,
   (b) a second lateral MOSFET formed on the surface of the semiconductor die, the second lateral MOSFET having a first conduction terminal coupled to a control terminal of the first lateral MOSFET, a second conduction terminal coupled to a third package terminal, and a control terminal coupled to a fourth package terminal, and
   (c) a resistor coupled between the first package terminal and the control terminal of the first lateral MOSFET.

15. The chip-scale package of claim 14, wherein the first and second lateral MOSFETs are formed using a lateral double diffused metal oxide semiconductor structure.

16. The chip-scale package of claim 14, wherein the first and second lateral MOSFETs are formed on a substrate having a first conductivity type.

17. The chip-scale package of claim 16, wherein the first lateral MOSFET includes:
a source region of a second conductivity type formed on the surface of the semiconductor die;
a first well region of the second conductivity type formed on the surface of the semiconductor die;
a drain region of the second conductivity type formed on the surface of the semiconductor die within the first well region;
an oxide layer formed over a channel region between the source region and the first well region; and
a gate region formed over the oxide layer.

18. The chip-scale package of claim 16, wherein the second lateral MOSFET includes:
a second well region of the second conductivity type formed on the surface of the semiconductor die;
a source region of the first conductivity type formed on the surface of the semiconductor die within the second well region;
a third well region of the second conductivity type formed on the surface of the semiconductor die;
a drain region of the first conductivity type formed on the surface of the semiconductor die within the third well region;
a drift region of the first conductivity type formed on the surface of the semiconductor die in contact with the drain region;
an oxide layer formed over a channel region between the source region and the drift region; and
a gate region formed over the oxide layer.

19. The chip-scale package of claim 18, wherein the second and third well regions merge under the gate region.

20. The chip-scale package of claim 16, wherein the first lateral MOSFET includes:
a first well region of a second conductivity type formed on the surface of the semiconductor die;
a source region of the first conductivity type formed on the surface of the semiconductor die within the first well region;
a drain region of the first conductivity type formed on the surface of the semiconductor die within the first well region;
a drift region of the first conductivity type formed on the surface of the semiconductor die in contact with the drain region;
an oxide layer formed over a channel region between the source region and the drift region; and
a gate region formed over the oxide layer.

21. The chip-scale package of claim 20, wherein the second lateral MOSFET includes:
a source region of the second conductivity type formed on the surface of the semiconductor die;

a drain region of the second conductivity type formed on the surface of the semiconductor die;

a drift region of the second conductivity type formed on the surface of the semiconductor die in contact with the drain region;

an oxide layer formed over a channel region between the source region and the drift region; and a gate region formed over the oxide layer.

* * * * *